United States Patent
Hargrove et al.

(10) Patent No.: US 7,598,838 B2
(45) Date of Patent: Oct. 6, 2009

(54) VARIABLE INDUCTOR TECHNIQUE

(75) Inventors: Michael Hargrove, Clinton Corners, NY (US); Joseph Petrosky, LaGrangeville, NY (US)

(73) Assignee: Seiko Epson Corporation, Tokyo (JP)

( * ) Notice: Subject to any disclaimer, the term of this patent is extended or adjusted under 35 U.S.C. 154(b) by 88 days.

(21) Appl. No.: 11/073,059

(22) Filed: Mar. 4, 2005

(65) Prior Publication Data

US 2006/0197642 A1 Sep. 7, 2006

(51) Int. Cl.
*H01F 5/00* (2006.01)
(52) U.S. Cl. .................................. 336/200; 333/174
(58) Field of Classification Search ............. 336/200
See application file for complete search history.

(56) References Cited

U.S. PATENT DOCUMENTS

| | | | |
|---|---|---|---|
| 4,959,631 A | 9/1990 | Hasegawa et al. | |
| 5,034,717 A | 7/1991 | Shinkai | |
| 5,872,489 A * | 2/1999 | Chang et al. | 331/179 |
| 5,994,985 A | 11/1999 | Pehlke et al. | |
| 6,232,847 B1 | 5/2001 | Marcy, 5th et al. | |
| 6,380,608 B1 | 4/2002 | Bentley | |
| 6,480,086 B1 | 11/2002 | Kluge et al. | |
| 6,501,363 B1 | 12/2002 | Hwu et al. | |
| 6,549,096 B2 * | 4/2003 | Groves et al. | 333/174 |
| 6,573,822 B2 | 6/2003 | Ma et al. | |
| 6,707,367 B2 * | 3/2004 | Castaneda et al. | 336/200 |
| 2005/0068146 A1 * | 3/2005 | Jessie | 336/200 |

* cited by examiner

*Primary Examiner*—Elvin G Enad
*Assistant Examiner*—Joselito Baisa
(74) *Attorney, Agent, or Firm*—Rosalio Haro

(57) ABSTRACT

An integrated variable inductor is achieved by placing a second closed-loop inductor immediately above or below a primary inductor. The closed-loop configuration of the second inductor may be broken on-chip by several ways, including use of a transistor to selectively short together both ends of the second inductor. If one wishes to alter the inherent inductance characteristics of the primary inductor, the transistor coupling both ends of the second inductor is actuated. Thus, a current applied to the primary inductor induces a current in the second inductor by inductive coupling. The second current in the second inductor then alters the impedance of the primary inductor by mutual inductance. Thus, the inductance value of the primary inductor is altered. To remove the influence of the second inductor on the primary inductor, the closed-loop configuration of the second inductor is broken.

17 Claims, 7 Drawing Sheets

VARIABLE INDUCTOR TECHNIQUE

BACKGROUND OF THE INVENTION

1. Field of the Invention

The present invention is geared toward the field of integrated inductors, and particularly toward the construction of an integrated variable inductor whose inductance value may be adjusted on-chip.

2. Description of the Related Art

Inductors are an integral part of discrete radio frequency, RF, circuitry. Particularly, discrete variable inductors are typically used for tuning purposes.

With reference to FIG. 1, a discrete variable inductor 11 may consist of an inductor coil 12 between two end points (A1 and B1) and a mechanically adjustable armature 13 that may be slid along coil 12. One end 15 of armature 13 contacts coil 12 and the other end C1 provides an electrical contact for producing the desired variable inductance. The inductance value, L, of an inductor is dependent upon (among other factors) the number of windings in the coil between to electrical contact points, and one may adjust the number of winding between end points A1 and C1 by sliding armature 13 along coil 12. Such a variable inductor 11, however, is not available in integrated circuit technology, where mechanically adjustable armatures are not practical.

Nonetheless, fixed inductors are available in integrated circuits. With reference to FIG. 2, a typical integrated inductor 14 may be formed by a spiral of metal 12 on a first metal layer (such as metal layer M6) with two distinct endpoint connections A2 and B2, one on metal layer 6 and the other on a metal layer immediately below it, i.e. metal layer M5. A cross-section of inductor 14 fabricated in a typical silicon (Si) CMOS technology is shown in FIG. 2. A via 16 provides connection between spiral 12 on metal layer M6 and a metal lead 18 on metal layer M5, which provides the second endpoint B2. The entire inductor 14 is typically embedded in a dielectric 20 (such as $SiO_2$) some finite distance above the Si substrate layer 22.

AC current flowing between endpoints A2 and B2 (through spiral 12 on metal layer M6, through via 16, and though lead 18 on metal layer M5) realizes the inductance. The characteristics of the inductor is primarily a function of the type of metal used (Al vs Cu), the number of spirals, the width of the metal lines, the spacing between the metal lines, and the distance between the metal layer M6 and the Si substrate 22. The overall value of inductance L is found by summing the self inductance of each wire segment and the positive and negative mutual inductance between all possible wire segment coupling pairs. The mutual inductance between two wires depends on their angle of intersection, length, and separation. Two wires orthogonal to each other have no mutual inductive coupling since their magnetic flux are not linked together. The current flow directions in the wires determine the sign of the coupling. The coupling is positive if the currents in the two wires are in the same direction and negative if the currents in the two wires are in the opposite direction. Process variations can alter any or all of physical characteristics that determine the inductor's inductance value.

An approach toward mitigating this variation between the designed, i.e. intended, operating point of an integrated inductor and its physical operating point after construction, is to construct a very large inductor whose process variations may be a small percentage of its intended value.

With reference FIG. 3, one such inductor may have multiple spirals on multiple process layers (i.e. metal layers) of an integrated circuit. For example, inductor 30 consists of three spirals 31, 32 and 33 on three respective metal layers M1, M2 and M3. Vias 35, 37 and 39 interconnect the three spirals 31, 32, and 33 to produce one large inductor with end points A3 and B3. FIG. 4 is an electrical representation of inductor 30 showing three inductor components 31-33 interconnected by vias 35-39 between end points A3 and B3.

Nonetheless, the large geographic area (which results in possible large amounts of capacitive coupling) as well as the many variations in their manufacturing process still make inductors highly susceptible to variations in their manufacturing process. As a result, the inductance value (and thereby the resonant operating point) of a physical integrated inductor is likely to differ from its intended operating point.

Nevertheless, on-chip inductors are still used pervasively in integrated RF circuit design applications. The impedance value of the inductor varies with frequency and determines the circuit's operating design point. In various circuit applications (e.g. voltage controlled oscillator, VCO), process parameter variations can alter the design point of a given circuit such that the optimized design value of an inductor turns out not to be an optimized value for the actual circuit application on-chip. Process variations can also alter the inductor's inductance value such that the circuit's physical operating point deviates from the desired design point. In such cases, one would like to modify the inductor impedance characteristics, and thereby the inductance value, on-chip by some noninvasive means. The ability to modify an inductor value on-chip would provide circuit designers a great deal of freedom to optimize their respective circuits post-process.

OBJECTS OF THE INVENTION

An object of the invention is to provide an integrated inductor whose inductance value may be adjusted on-chip.

A further object of the present invention is that the inductance of the inductor may be increased or decreased, as needed, using the mechanism of the present invention.

SUMMARY OF THE INVENTION

The present invention provides additional, close loop inductors above and/or below a primary inductor. Each of the closed loop inductors may have its closed loop, i.e. closed current path, selectively broken. When the current path of the close loop inductor is not broken, it can generate an induced current due to an applied current in the primary inductor. This establishes a mutual inductance that alters the primary inductor's impedance, and thus alters its operating point. If the inductance value of the primary inductor is lower than desired, then the closed circuit loop of the secondary inductor may be opened, i.e. broken, in which case it will no longer be able to generate a an induced current and thereby eliminate any loading effects on the primary inductor.

Therefore, by placing a second spiral wire (i.e. inductor) above and/or below the primary inductor, a voltage will be induced in the second spiral inductor. This induced voltage will cause current to flow in the second spiral inductor when its two ends are tied together. The induced voltage and subsequent current flow will then induce a voltage in the primary inductor and thus alter its characteristics.

The second spiral inductor can be above or below, or both above and below the primary inductor. In the latter case, the four end-point terminal connections of the two second spiral inductors can be tied together or tied separately together to modify the primary inductance in more than one finite way. With this configuration it is possible to tie together the two pairs of end-point terminals, or to tie all four end-point terminal together in order to modify the primary inductance in finite incremental steps.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

DESCRIPTION OF THE PREFERRED EMBODIMENTS

An initial attempt toward providing an integrated variable inductor might be to construct an integrated inductor with several fixed tapping points and a switching network, but physical limitations would likely make such a configuration impractical with current manufacturing techniques.

Figure 1:
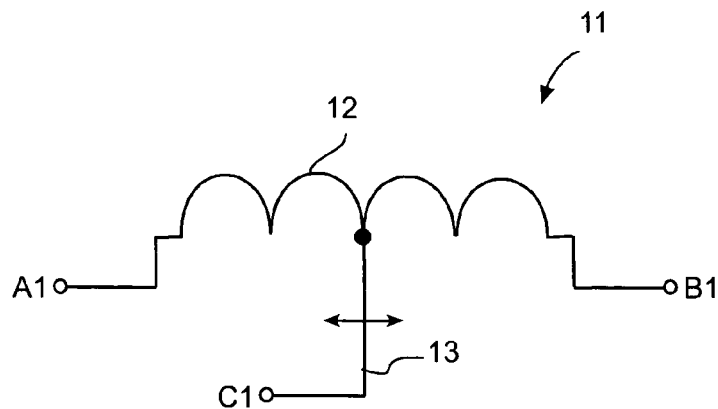
FIG. 1 is a symbolic representation of a typical discrete variable inductor.
Figure 2:
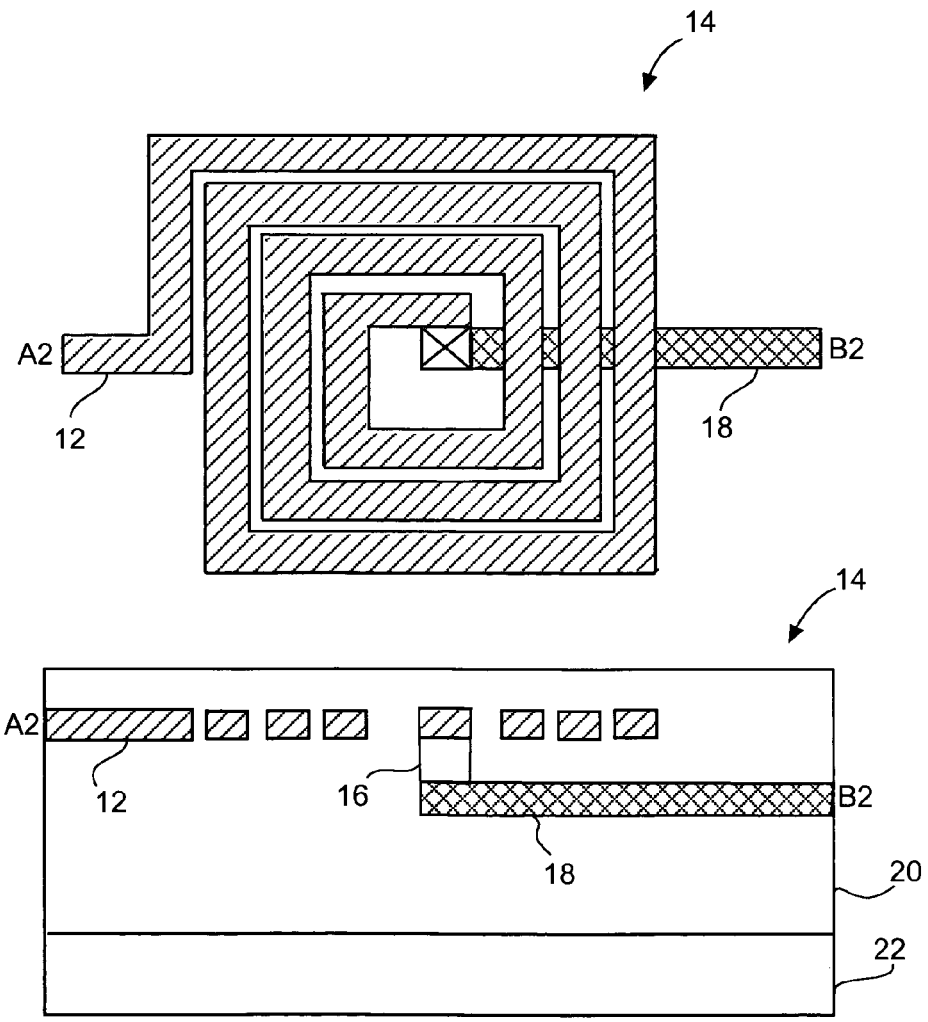
FIG. 2 is a top and cross-sectional view of a typical integrated inductor having a spiral on one process layer.
Figure 3:
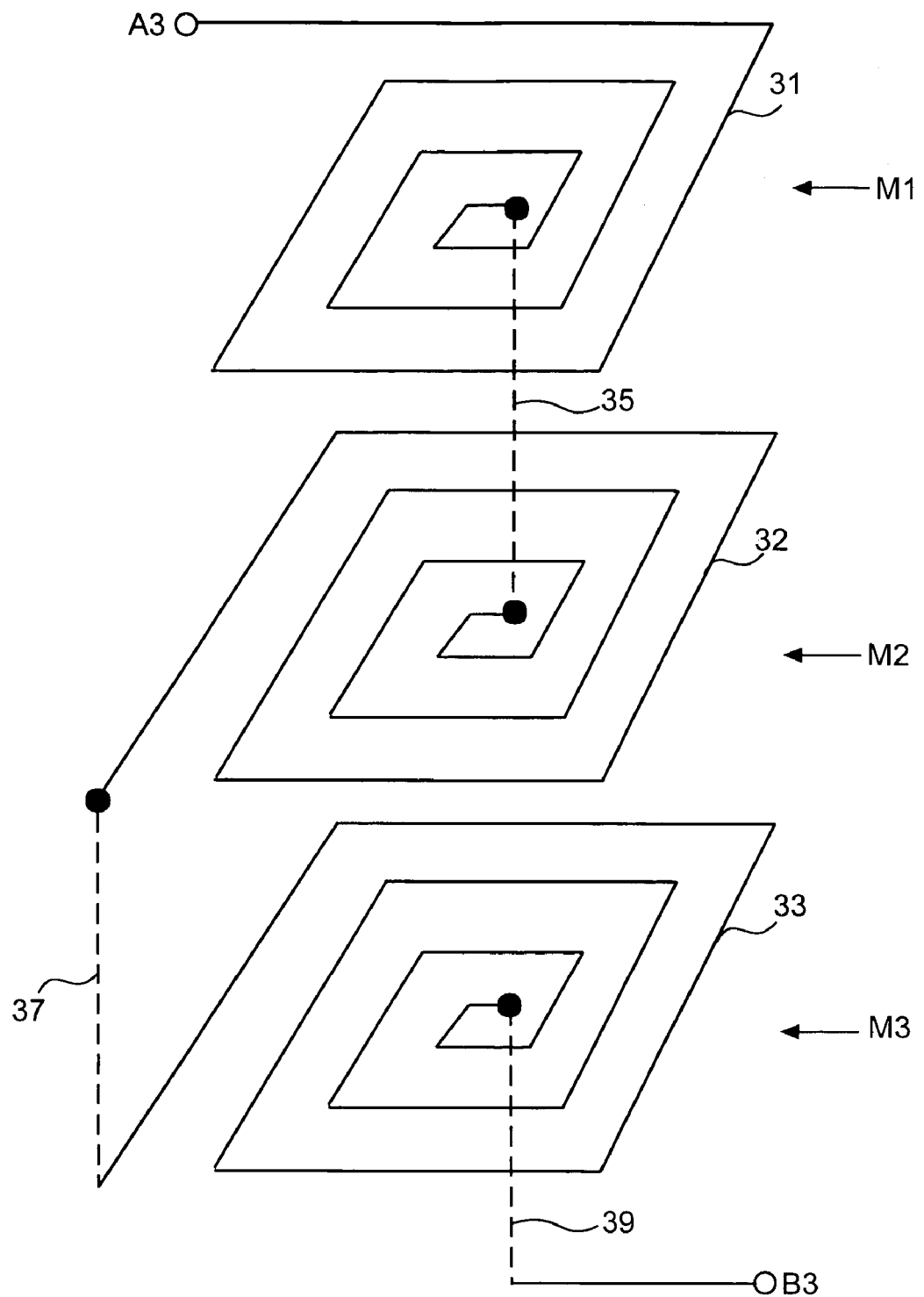
FIG. 3 is a symbolic view of a prior art integrated inductor having interconnected spirals on multiple process layers.
Figure 4:
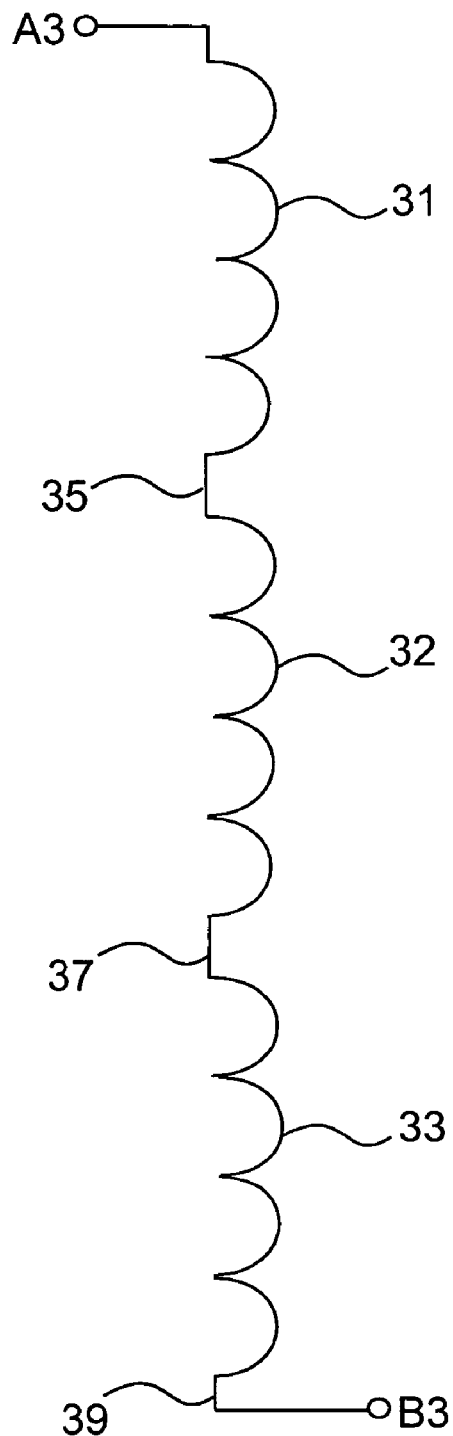
FIG. 4 is a schematic representation of the inductor of FIG. 3.
Figure 5:
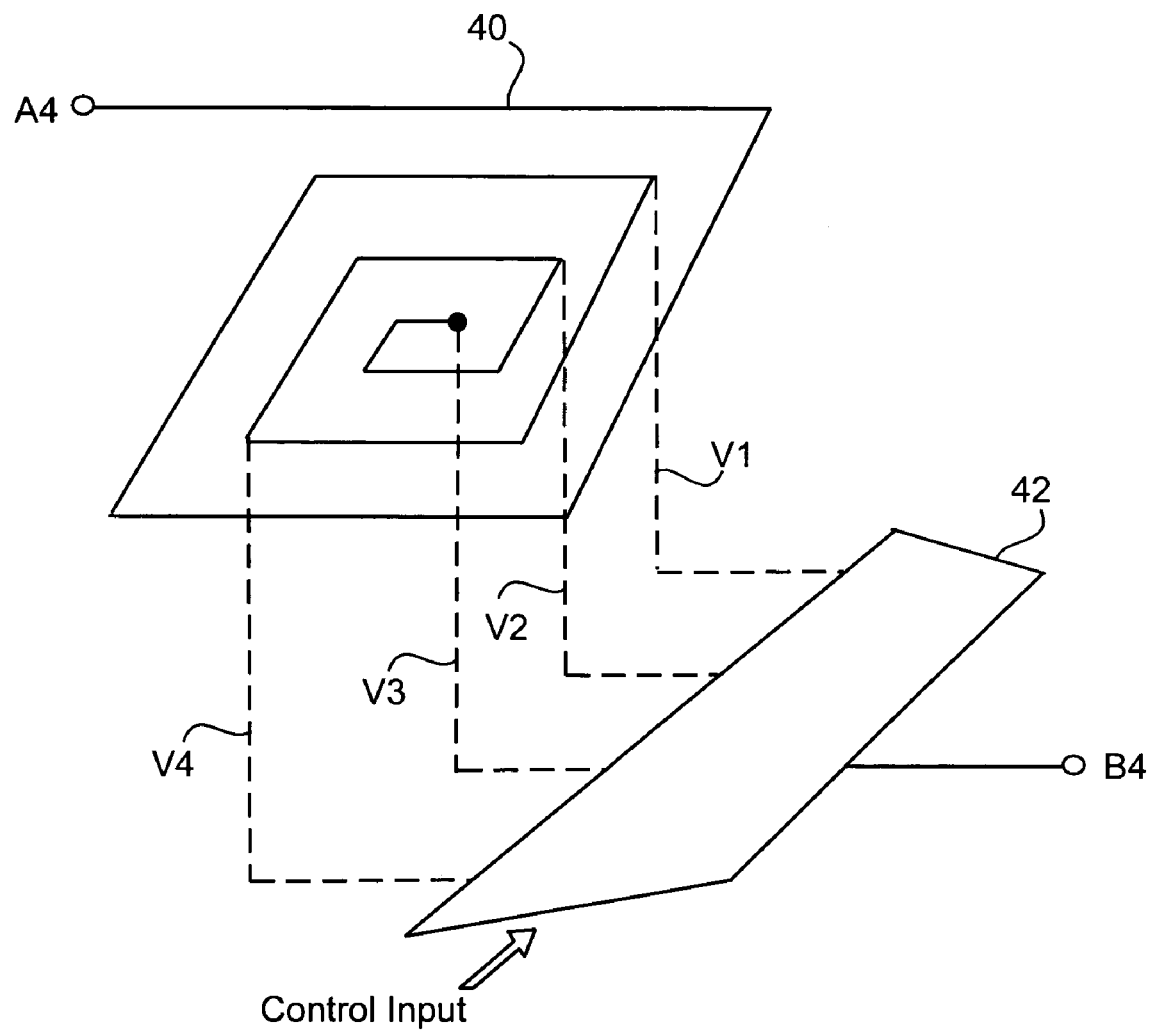
FIG. 5 is symbolic representation of a. variable inductor that may be integratable onto an IC.

With reference to FIG. 5, such a configuration may consist of an integrated spiral inductor 40 and a first end point A4 on a first process layer, and a multiplexor 42 producing a variable second end point B4 on a second process layer. In the present case, vias V1 through V4 provide four possible tap points at four distinct locations along spiral 40. Thus, one could conceivable tap spiral 40 at any one of the four tap points producing an inductor of varying length by applying an appropriate selection signal to the control input of multiplexor 42. However, the addition of multiple vias as tap points and circuitry for multiplexor 42 introduces a large amount of parasitic capacitive and inductive variables that can greatly affect the desired inductance value of spiral inductor 40, and thus alter its operating point. Further, it is likely that a great number of spirals would be needed to provide a practical amount of inductance difference between tap points, which would result in both larger area requirements, larger amounts of capacitive coupling, and larger intrinsic resistance within the spiral 40, all of which would further complicate the calculation and utility of the inductor's desired operating point.

Figure 6:
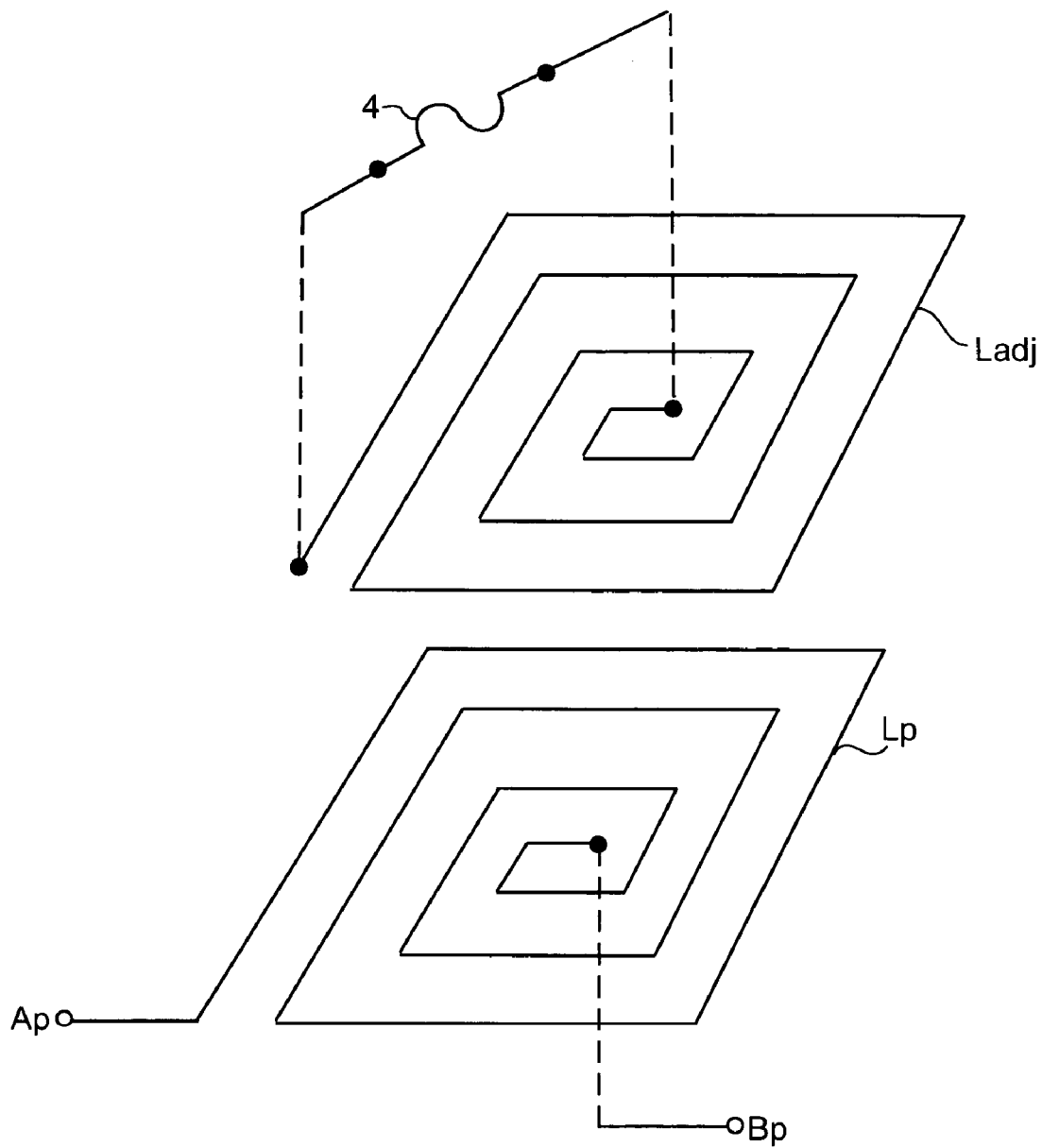
FIG. 6 is a symbolic representation of a conceptual variable integrated inductor in accord with the present invention.

A more practical approach to providing an integrated variable inductor is shown in FIG. 6. In this case, Lp is the inductor whose inductance value is to be adjusted. It is to be understood that the input and output nodes, Ap and Bp, of inductor Lp would be coupled to additional load circuitry (not shown), such as an oscillator whose oscillation frequency is dependent upon the inductance value of Lp. A second inductor, Ladj, is unloaded in a closed loop configuration and is located next to inductor Lp in such as a way as to provide inductive coupling with Lp. As it is known in the art, inductor components will not couple together if they are oriented orthogonal to each other since their emanating magnetic field will not link to each other. In the presently preferred embodiment, the secondary inductor, Ladj, is located on a layer above or below the layer on which inductor Lp is constructed.

As shown, secondary inductor Ladj forms a closed loop (with both its ends couple to each other by means of a fuse 4), and is located above Lp to form inductive coupling with Lp. In operation, when an AC current is applied to inductor Lp, an induced current is produced in adjacent inductor Ladj due to inductive coupling. The induced current in Ladj produces an opposing current in Lp due to mutual inductance between both inductors. Thus, Ladj functions as an inductive load on primary inductor Lp, which alters its inductance value L and thereby alters its operating point.

In the present case, adjacent inductor Ladj has the affect of lowering the inductance value of primary inductor Lp. Thus if after construction, it is found that the inductance value L of first inductor Lp needs to be increased, fuse 4 may be broken to break the closed current loop of inductor Ladj. This would prevent current from being induced within Ladj and thereby break the inductive coupling between Ladj and Lp. As a result, the influence of Ladj on the inductance L of inductor Lp would stop and the inductance value of Lp would rise to its inherent value. Fuse 4 may be blown in any of various known methods, such as by application of a laser cutter, or by the application of a high voltage or current from on-chip circuitry, not shown.

In the present case, it is preferred that the adjacent inductor Ladj be located immediately over, or immediately under, Lp without any offset since this would produce the most inductive coupling between both inductors. It is to be understood, however, that an offset may be introduced to alter the amount of inductive coupling between the first inductor Lp and the second inductor Ladj. Of particular interest is that adjacent inductor Ladj can be made to selectively form an unloaded closed loop.

In a preferred embodiment, fuse 4 is replaced by a switching means, such as a transistor, that may be selectively opened or closed by control circuitry (not shown) on the same substrate that holds inductors Lp and Ladj. In this way, the inductance value of first inductor Lp may be selectively altered (increased or decreased) without the need of external aids, such as a laser cutter.

Figure 7:
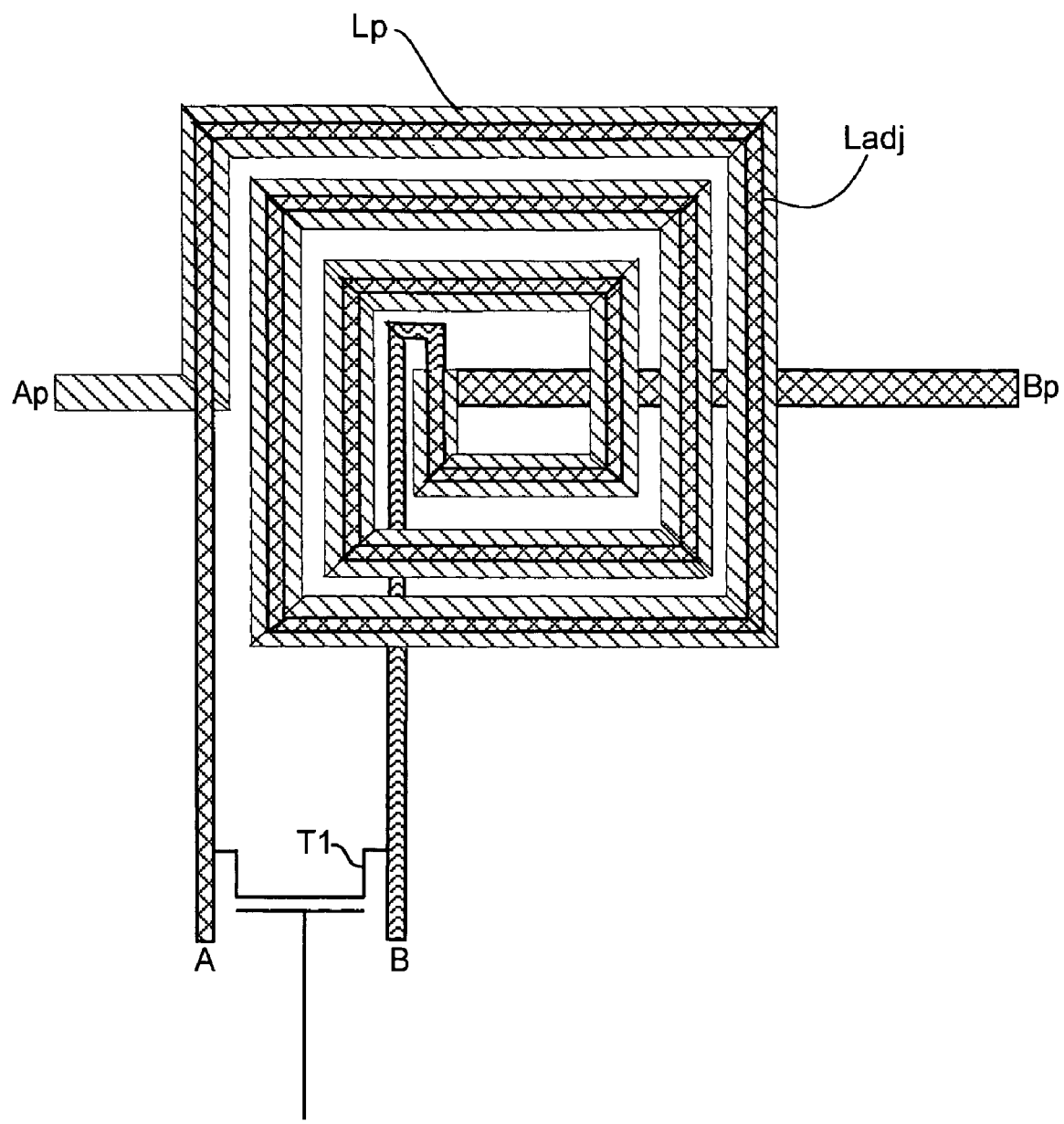
FIG. 7 is a preferred implementation of a variable integrated inductor in accord with the present invention.

With reference to FIG. 7, a semi-layout view, of the present invention places second inductor Ladj spiral wire above and/or below the first inductor Lp. A voltage applied to first inductor Lp will induce a voltage in second inductor Ladj. This induced voltage will cause current to flow in inductor Ladj when its two ends A and B are selectively tied together, such as by means of transistor T1. The induced voltage and subsequent current flow in inductor Ladj will then induce a voltage in primary inductor Lp and thereby alter its characteristics.

As explained above, the adjacent inductor Ladj can be above or below, or both above and below, the primary inductor. If adjacent inductors are place both above and below the primary inductor, the four terminal connections of the two adjacent inductors can be tied together or tied separately together to modify the inductance of the primary inductor in more than one finite way.

Figure 8:
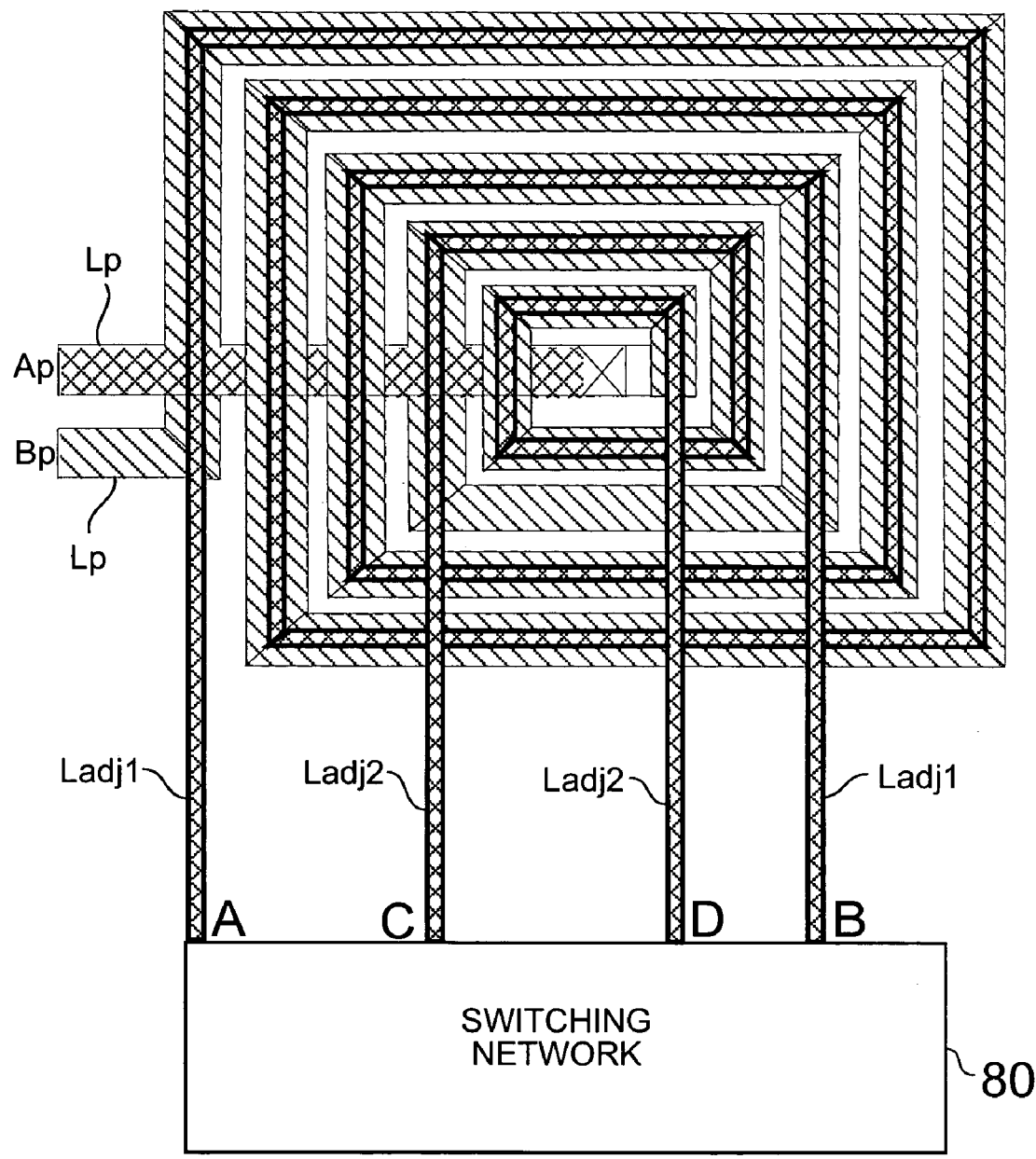
FIG. 8 is another preferred implementation of the variable integrated inductor in accord with the present invention.

With reference to FIG. 8, another embodiment includes two adjacent inductors Ladj1 and Ladj2 above the primary inductor Lp. Each of inductors Ladj1 and Ladj2 provides two terminal connections, A-B and C-D. With this configuration it is possible to tie nodes A and B together, or nodes C and D together, four nodes together, or any combination in order to modify the inductance of primary inductor Lp in finite incremental steps. As shown, end terminals A-C may be interconnected by means of a switching network 80.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A variable inductor comprising:
   a first inductor;
   a second inductor in physical arrangement with said first inductor for permitting inductive coupling with said first inductor, said second inductor having a first front-end node at its front end and a first back-end node at its back end, said second inductor being formed above said first inductor;
   a third inductor in physical arrangement with said first inductor for permitting inductive coupling with said first inductor, said third inductor having a second front-end node at its front end and a second back-end node at its back end, said third inductor being formed below said first inductor; and
   a switching network for selectively interconnecting the first front-end and back-end nodes of said second inductor so as to create a closed current loop through a said second inductor, and for selectively interconnecting the second front-end and back-end nodes of said third inductor so as to create a closed current loop through a said third inductor.

2. The variable inductor of claim 1, wherein:
   said first inductor has a first spiral arm, said second inductor has second spiral arm, and said third inductor has a third spiral arm;
   said first spiral arm overlaps said third spiral arm;
   said second spiral arm overlapping said first spiral arm; and
   said second spiral arm does not overlap said third spiral arm.

3. An integrated circuit variable inductor comprising:
   a first inductor on a substrate;
   a second inductor arranged over said substrate and above said first inductor to permit inductive coupling with said first inductor, said second inductor having a first front-end node at its front end and a first back-end node at its back end, said second inductor having a contiguous conductive path between its front end and back end;
   a third inductor arranged under said substrate and below said first inductor to permit inductive coupling with said first inductor, said third inductor having a second front-end node at its front end and a second back-end node at its back end, said third inductor having a contiguous conductive path between its front end and back end;
   a switching network to selectively shunt together said first front-end and first back-end nodes so as to form a short circuit about said second inductor, and to selectively shunt together said second front-end and second back-end nodes so as to form a short circuit about said third inductor, and to selectively shunt together said first front-end node to said second back-end node and said first back-end node to said second front-end node so as to serially interconnect said second and third inductors in a closed circuit loop.

4. The integrated circuit variable inductor of claim 3, wherein:
   said first inductor resides within a first layer set on said substrate, and said second inductor resides within a second layer set on said substrate, said first and second layer sets having no layer in common.

5. The integrated circuit variable inductor of claim 3, wherein said first inductor has a first spiral arm, said second inductor has a second spiral arm that overlaps said first spiral arm.

6. The integrated circuit variable inductor of claim 5, wherein the spiral of said second spiral arm is greater than 360 degrees.

7. A variable inductor comprising:
   a first inductor having a first spiral arm, a first front-end node and a first back-end node;
   a second inductor having a second spiral arm, a second front-end node and a second back-end node, said second spiral arm being above said first spiral arm;
   a third inductor having a third spiral arm, a third front-end node and a third back-end node, said third spiral arm being below said first spiral arm;
   a switching network for selectively shunting together said second front-end node to said second back-end node, and for selectively shunting together said third front-end node to said third back-end node.

8. The variable inductor of claim 7, wherein said second spiral arm at least partially overlaps said first spiral arm.

9. The variable inductor of claim 8, wherein said first spiral arm at least partially overlaps said third spiral arm, and said second spiral arm has no overlap with said third spiral arm.

10. The variable inductor of claim 7, wherein said first spiral arm fully overlaps at least one of said second and third spiral arms.

11. The variable inductor of claim 7, wherein said second spiral arm lies within the innermost radial extent of said third spiral arm and has no overlap with said third spiral arm.

12. The variable inductor of claim 7, wherein said third spiral arm lies within the innermost radial extent of said second spiral arm and has no overlap with said second spiral arm.

13. The variable inductor of claim 7, wherein a line width of said first spiral arm is wider than a line width of said second spiral arm.

14. The variable inductor of claim 7, wherein the first spiral arm and the second spiral arm are insulated by a dielectric layer.

15. The variable inductor of claim 7, wherein said first spiral arm fully encompasses said second and third spiral arms.

16. An integrated circuit comprising:
   a substrate; and
   a variable inductor according to claim 7 formed over said substrate.

17. A radio frequency (RF) circuit comprising:
   a receiver circuit; and
   a variable inductor according to claim 7 formed on a substrate.

* * * * *